(12) United States Patent
Ohta

(10) Patent No.: US 7,603,903 B2
(45) Date of Patent: Oct. 20, 2009

(54) VIBRATION-TYPE ANGULAR RATE SENSOR

(75) Inventor: Tameharu Ohta, Takahama (JP)

(73) Assignee: DENSO CORPORATION, Kariya (JP)

( * ) Notice: Subject to any disclaimer, the term of this patent is extended or adjusted under 35 U.S.C. 154(b) by 96 days.

(21) Appl. No.: 11/119,695

(22) Filed: May 3, 2005

(65) Prior Publication Data

US 2005/0257615 A1 Nov. 24, 2005

(30) Foreign Application Priority Data

May 18, 2004 (JP) ............................. 2004-147623

(51) Int. Cl.
*G01P 9/04* (2006.01)
(52) U.S. Cl. ..................... 73/504.12; 73/493
(58) Field of Classification Search ............. 73/504.12, 73/504.14, 493
See application file for complete search history.

(56) References Cited

U.S. PATENT DOCUMENTS 6,593,663 B2 7/2003 Ikezawa et al.
6,658,937 B2 * 12/2003 Ao et al. .................. 73/504.14
7,263,885 B2 * 9/2007 Goto ....................... 73/514.32
2004/0020291 A1 * 2/2004 Katsumata et al. ....... 73/514.32

FOREIGN PATENT DOCUMENTS

| JP | 2000-55667 | 2/2000 |
| JP | A-2000-249562 | 9/2000 |
| JP | 2003-21647 | 1/2003 |

* cited by examiner

*Primary Examiner*—John E Chapman
(74) *Attorney, Agent, or Firm*—Posz Law Group, PLC

(57) ABSTRACT

An angular rate sensor includes a sensor chip having an oscillator vibrating at a predetermined frequency and detecting an angular velocity applied to this oscillator around a predetermined rotation axis. A circuit chip, laminated with the sensor chip, has a circuit formed on a surface thereof to detect the angular velocity based on a signal obtained from the sensor chip. The sensor chip and the circuit chip are bonded with an adhesive film. A resonance frequency of the sensor chip is smaller than $(1/2)^{1/2}$ times a driving frequency of the oscillator in a condition that adjustment is applied to at least one of configuration or elastic coefficient of the adhesive film.

9 Claims, 6 Drawing Sheets

VIBRATION-TYPE ANGULAR RATE SENSOR

CROSS-REFERENCE TO RELATED APPLICATION

This application is based upon and claims the benefit of priority from earlier Japanese Patent Application No. 2004-147623 filed on May 18, 2004 so that the description of which is incorporated herein by reference.

BACKGROUND OF THE INVENTION

The present invention relates to a vibration-type angular rate sensor which drives and vibrates an oscillator to detect an angular velocity.

The vibration-type angular rate sensor is, for example, formed by etching a semiconductor substrate to form a base portion, an oscillator, and drive electrodes of this oscillator. According to this kind of angular rate sensor, alternating-current signals (i.e. drive signals) having mutually opposite phases are applied to a pair of drive electrodes to cause the oscillator to vibrate in the predetermined direction. If any angular velocity is applied in a condition that the oscillator vibrates regularly in the predetermined direction, the oscillator will start vibrating in a perpendicular direction due to a Coriolis force caused in response to the applied angular velocity. The vibration-type angular rate sensor has detection electrodes detecting a change in the electrostatic capacity occurring due to this vibration and detects the applied angular velocity.

According to this kind of angular rate sensor, thermal stresses applied from the outside to the sensor chip and/or vibrations transmitted from the outside to the sensor chip give adverse effects on angular velocity detect accuracy of the sensor. Therefore, the angular rate sensor is required to have sufficient capability of relaxing thermal stresses and assuring vibration-proof properties.

In this respect, the Japanese patent application Laid-open No. 2000-249562 (hereinafter, referred to as prior art 1) discloses an angular rate sensor capable of reducing a bonding area with appropriate hollow spaces provided on a package for relaxing the thermal stress. Furthermore, the Japanese patent application Laid-open No. 2003-21647 (hereinafter, referred to as prior art 2) discloses an arrangement capable of relaxing the thermal stress by using a silicone adhesive film to bond a sensor chip and a circuit chip. Moreover, the Japanese patent application Laid-open No. 2000-55667 (hereinafter, referred to as prior art 3) discloses an angular rate sensor capable of assuring vibration-proof properties with a rubber vibration isolator supporting a package mounting an oscillator.

However, the sensor arrangement of the above-described prior art 1 is disadvantageous in that additional processing (or machining) is required to form a complicated surface of the package. This will increase the manufacturing costs. Furthermore, the bonding strength between the oscillator and the package tends to be incomplete. This will deteriorate frequency characteristics of the entire sensor structure. Furthermore, the above-described prior art 2 discloses nothing about vibration-proof properties of the angular rate sensor.

Moreover, the angular rate sensor disclosed in the above-described prior art 3 requires additional parts to be specially prepared to improve the vibration-proof properties. This will increase the costs.

SUMMARY OF THE INVENTION

In view of the above-described problems, the present invention has an object to provide an angular rate sensor with a sensor chip laminated with a circuit chip which is capable of improving vibration-proof properties of the sensor chip and also capable of relaxing a thermal stress caused by an adhesive film.

In order to accomplish the above and other related object, the present invention provides an angular rate sensor including a sensor chip and a circuit chip. The sensor chip, having an oscillator being driven to vibrate at a predetermined frequency, detects an angular velocity applied to the oscillator around a predetermined rotation axis. The circuit chip, laminated with the sensor chip, has a circuit formed on a surface thereof to detect the angular velocity based on a signal obtained from the sensor chip. The sensor chip and the circuit chip are bonded with an adhesive film. And, a resonance frequency of the sensor chip is smaller than a driving frequency of the oscillator in a condition that adjustment is applied to at least one of configuration or elastic coefficient of the adhesive film.

According to the angular rate sensor of the present invention, adjustment is applied to at least one of configuration or elastic coefficient of the adhesive film to satisfy the relationship that the resonance frequency of the sensor chip becomes smaller than the driving frequency of the oscillator. Thus, it becomes possible to improve vibration-proof properties of the sensor chip. Furthermore, the adhesive film used to bond the circuit chip with the sensor chip has lower elasticity, and accordingly it becomes possible to relax the thermal stress and prevent the distortion of the adhesive film from propagating to the sensor chip.

According to the angular rate sensor of the present invention, it is preferable that as a result of adjustment applied to at least one of configuration or elastic coefficient of the adhesive film to satisfy the relationship that the resonance frequency of the sensor chip becomes smaller than $(1/2)^{1/2}$ times the driving frequency of the oscillator. With this relationship, it becomes possible to surely attenuate or damp the vibrations of the sensor chip even in a case that the vibrations of the sensor chip are transmitted via the circuit chip and the package and returned to the sensor chip.

According to the angular rate sensor of the present invention, it is preferable that the adhesive film consists of a plurality of adhesive film portions separately provided between the sensor chip and the circuit chip, and the plural adhesive film portions are symmetrically arranged about a rotation center of the oscillator in the sensor chip and are spaced from the rotation center. With this arrangement, it becomes possible to secure vibration-proof properties of the sensor chip and prevent the resonance point in the rotation mode from lowering. Furthermore, it becomes possible to assure appropriate detection sensitivity of angular velocity.

Furthermore, in order to accomplish the above and other related object, the present invention provides another angular rate sensor including a sensor chip, a circuit chip, and a package. The sensor chip, having an oscillator being driven to vibrate at a predetermined frequency, detects an angular velocity applied to the oscillator around a predetermined rotation axis. The circuit chip, being laminated with the sensor chip, has a circuit formed on a surface thereof to detect the angular velocity based on a signal obtained from the sensor chip. The package accommodates the circuit chip laminated with the sensor chip. The circuit chip and the package are bonded with an adhesive film. And, at least one of configuration or elastic coefficient of the adhesive film is adjusted to realize a condition that a resonance frequency of an integrated unit of the sensor chip and the circuit chip becomes smaller than a driving frequency of the oscillator. Even in such an arrangement, it becomes possible to improve the vibration-proof properties of the sensor chip.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Preferred embodiments of the present invention will be explained hereinafter with reference to attached drawings.

First Embodiment

Hereinafter, a first embodiment of the present invention will be explained with reference to FIGS. 1 to 5.

Figure 1:
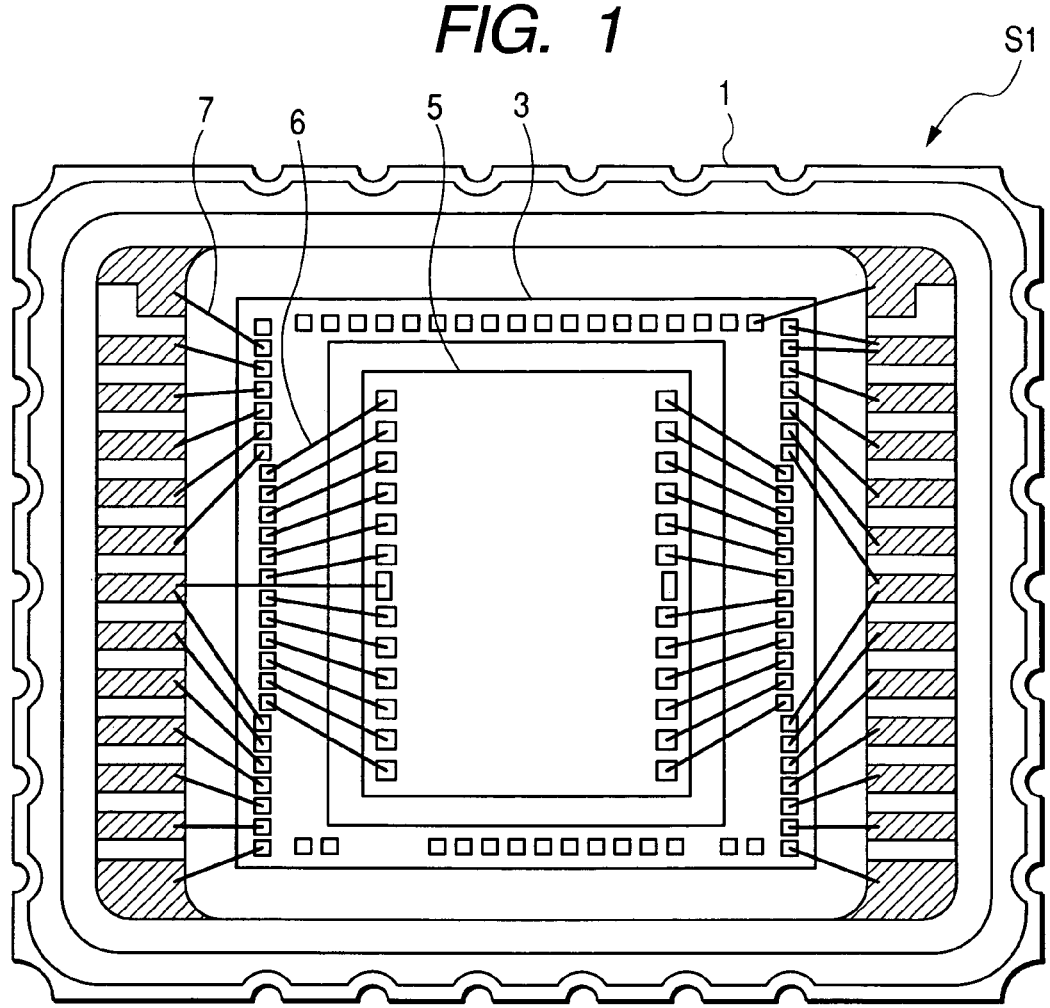
FIG. 1 is a plan view showing an angular rate sensor in accordance with a first embodiment of the present invention.
Figure 2:
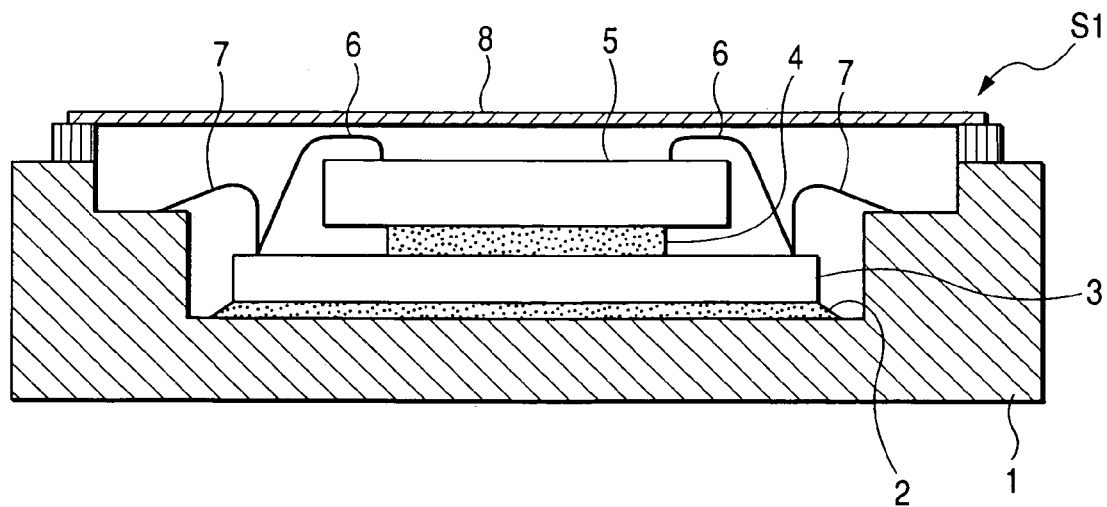
FIG. 2 is a cross-sectional view showing the angular rate sensor in accordance with the first embodiment of the present invention.

FIG. 1 is a plan view and FIG. 2 is a cross-sectional view, each showing an angular rate sensor S1 in accordance with a first embodiment of the present invention. As shown in FIGS. 1 and 2, the angular rate sensor S1 includes a ceramic package 1 which arranges a base portion of the sensor S1. The sensor S1 is attached to an appropriate portion of a member to be measured. A circuit chip 3 is mounted on a bottom of the ceramic package 1 and fixed there with an adhesive 2.

A bonding portion, defining a region where the sensor chip 5 is mounted, is provided on an upper surface of the circuit chip 3. A sensor chip 5 is laminated on this bonding portion via an adhesive film 4. According to this embodiment, the adhesive film 4 is a silicone-group film which has lower elasticity and appropriate viscoelastic characteristics.

The sensor chip 5 and the circuit chip 3 are electrically connected to each other via numerous bonding wires 6. The circuit chip 3 and the ceramic package 1 are electrically connected to each other via numerous bonding wires 7. A ceramic cover 8 is provided to close an upper opening of the ceramic package 1.

The sensor chip 5, having a sensor portion detecting an angular velocity (i.e. physical quantity), is arranged as a detecting element for detecting the angular velocity. The sensor chip 5 includes a base portion on which drive electrodes and detection electrodes are formed by etching, for example, a silicone substrate, and also includes a single oscillator supported via a drive beam to the base portion.

The sensor chip 5, in a condition that the oscillator is driven to vibrate regularly at a predetermined frequency, can receive an angular velocity applied to the vibrating oscillator around a predetermined rotation axis. The Coriolis force generating in this condition causes displacement of the oscillator. The sensor chip 5 has a movable electrode and a stationary electrode which cooperatively cause electrostatic capacity change (i.e. electric signal) representing an applied angular velocity. Thus, the sensor chip 5 produces an electric signal representing an angular velocity and outputs it to the circuit chip 3.

Furthermore, the circuit chip 3 has a circuit portion formed thereon to obtain an angular velocity based on a signal sent from the sensor chip 5. For example, the circuit chip 3 can be formed by forming MOS transistors and bipolar transistors on a silicone substrate according to a well-known semiconductor process. The circuit chip 3 has the capability of processing an electric signal entered from the sensor chip 5 and outputting a processed signal. The sensor chip 5 sends an electric signal (representing a capacitance change) to the circuit chip 3. The circuit chip 3 includes a C/V conversion circuit which converts the entered signal into a voltage signal and outputs the converted voltage signal as an angular velocity signal.

According to the above-described angular rate sensor S1, vibrations of the driven oscillator in the sensor chip 5 are transmitted along the route of sensor chip 5→circuit chip 3→package 1. Then, these vibrations are transmitted along the reverse route of package 1→circuit chip 3→sensor chip 5. The vibrations entering or returning from the outside to the sensor chip 5 give adverse effects on the detect accuracy of angular velocity in the sensor chip 5. Therefore, according to this embodiment, a resonance frequency fm of the sensor chip 5 is set to be smaller than a driving frequency fd of the oscillator in the sensor chip 5. This setting brings the effect of improving the vibration-proof properties of the sensor chip 5.

Figure 3:
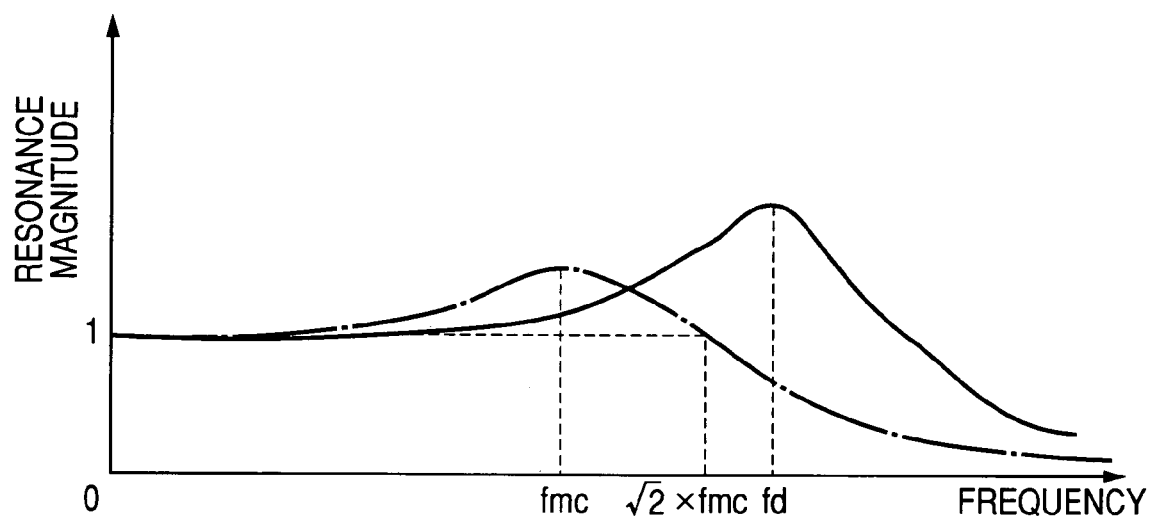
FIG. 3 is a graph showing the relationship between driving frequency fd of an oscillator in a sensor chip and structural resonance frequency fm of the sensor chip in accordance with the first embodiment of the present invention.

FIG. 3 is a graph showing the relationship between the driving frequency fd of the oscillator in the sensor chip 5 and the structural resonance frequency fm of the sensor chip 5.

In general, the mechanical frequency characteristics of a mass are as follows.

When the vibration frequency of the mass starts increasing from 0, the vibratory displacement gradually increases with increasing frequency and is maximized at a resonance frequency of the mass. Then, after passing the resonance frequency, the vibratory displacement continuously decreases and becomes equal to the initial level (i.e. the displacement at the frequency 0) when the vibration frequency of the mass reaches a value equal to $2^{1/2}$ times the resonance frequency of the mass. Then, the vibratory displacement gradually decreases with increasing vibration frequency and accordingly becomes smaller than the initial level (i.e. the displacement at the frequency 0). As understood from the above frequency characteristics, it is possible to attenuate or damp the vibratory displacement (i.e. vibration amplitude) when the mass causes vibrations at the frequency region where the displacement becomes smaller than the initial level (i.e. the displacement at the frequency 0).

Hence, according to this embodiment, the sensor chip 5 is arranged so as to satisfy the relationship that the driving frequency fd of the oscillator in the sensor chip 5 is larger than $2^{1/2}$ times the structural resonance frequency fm of the sensor chip 5 (i.e. $fd > 2^{1/2} \times fm$). This setting brings the effect of decreasing the attenuation or damping amount to a level lower than 1. Thus, it becomes possible to attenuate or damp the vibrations of the sensor chip 5 even in a case that the vibrations of the sensor chip 5 are transmitted and returned via the circuit chip 3 and the package 1 to the sensor chip 5.

According to this embodiment, an appropriate adjustment is applied to the configuration of the adhesive film 4 so that the resonance frequency fm of the sensor chip 5 becomes smaller. More specifically, in a case that the adhesive film 4 is regarded as a spring and the sensor chip 5 is regarded as a weight, the resonance frequency fm of the sensor chip 5 can be determined based on a spring constant of the adhesive film 4 and the mass of the sensor chip 5. The spring constant of the adhesive film 4 can be controlled by adjusting the bonded area, thickness, or physical properties (e.g. elastic coefficient).

Figure 4:
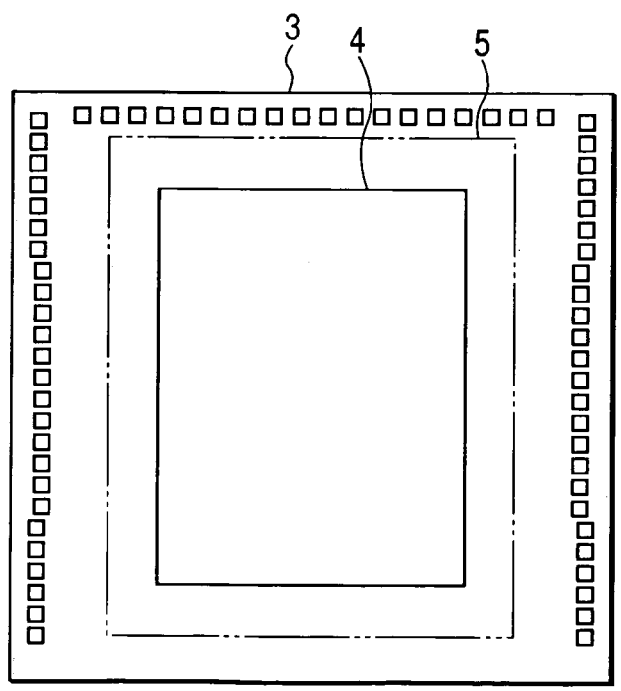
FIG. 4 is a plan view showing a practical example of an adhesive film formed on a circuit chip in accordance with the first embodiment of the present invention.
Figure 5:
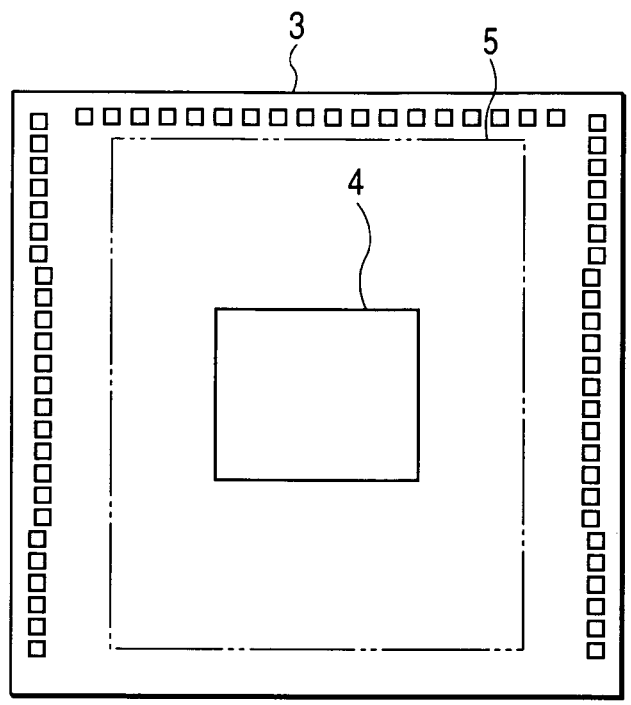
FIG. 5 is a plan view showing another practical example of the adhesive film formed on a circuit chip in accordance with the first embodiment of the present invention.

FIGS. 4 and 5 are plan views showing practical examples of planar configuration of the adhesive film 4 provided on the circuit chip 3. In FIGS. 4 and 5, an alternate long and two short dashes line represents the sensor chip 5. As shown in FIGS. 4 and 5, the adhesive film 4 of this embodiment is disposed at the central region of the sensor chip 5 and is smaller in area than the sensor chip 5. Reducing the bonded area of the adhesive film 4 in this manner brings the effect of reducing the spring constant. Thus, this embodiment can reduce the resonance frequency fm of the sensor chip 5. Furthermore, as comparatively shown in FIGS. 4 and 5, appropriately changing the configuration of the adhesive film 4 in accordance with the mass of sensor chip 5 can realize constant vibration-proof characteristics.

Furthermore, increasing the thickness of the adhesive film 4 brings the effect of decreasing the spring constant. Moreover, reducing the elastic coefficient of the adhesive film 4 brings the effect of decreasing the spring constant. Accordingly, so as to satisfy the above-described relationship $fd > 2^{1/2} \times fm$ in accordance with the mass of the sensor chip 5, it is preferable to adjust the structural resonance frequency fm of the sensor chip 5 by adjusting the area, thickness, and physical properties (e.g. elastic coefficient) of the adhesive film 4 by alone or by combination.

In determining practical values of the driving frequency fd of the oscillator in the sensor chip 5 and the structural resonance frequency fm of the sensor chip 5, it is desirable to satisfy the above-described relationship of $fd > 2^{1/2} \times fm$. However, as far as the relationship of $fd > fm$ is satisfied, it is possible to improve the vibration-proof properties of the sensor chip 5.

Furthermore, the adhesive film 4 is a viscoelastic material and accordingly it has sufficient damping characteristics to attenuate or damp the vibrations. In other words, the adhesive film 4 has a low Q value at the resonance point. Therefore, the change in the vicinity of the resonance point is small. And, change of the characteristics is moderate.

Furthermore, the adhesive film 4 has lower elasticity and can relax the thermal stress. This is effective in preventing the distortion of the adhesive film 4 from being transmitted to the sensor chip 5. Thus, it becomes possible to suppress the variation of chip characteristics caused in response to elastic coefficient change of the adhesive film 4.

Second Embodiment

Next, a second embodiment of the present invention will be explained with reference to FIGS. 6 to 9. The second embodiment is different from the above-described first embodiment in that adhesive film 4 is separated or divided into a plurality of adhesive film portions.

The above-described first embodiment can improve the vibration-proof properties. However, in the case that the area of adhesive film 4 is reduced at only one point corresponding to the central region of the sensor chip 5, the resonance point of the rotation mode in the sensor chip 5 will decrease. More specifically, when an angular velocity is applied around a rotation axis, the rotational force is transmitted along the route of package 1→circuit chip 3→sensor chip 5. In the case that reducing the area of the adhesive film 4 is performed at only one point corresponding to the central region of the sensor chip 5, the bonding portion between the circuit chip 3 and the sensor chip 5 is positioned closely to the central region of the sensor chip 5 (i.e. the rotation center). Thus, the transmitting distance of the rotational force becomes shorter. As a result, the rotational force cannot be easily transmitted to the sensor chip 5. The resonance point in the rotation mode will decrease and the detection sensitivity of angular velocity will deteriorate.

Hence, the second embodiment uses the adhesive film 4 consists of a plurality of adhesive film portions being provided separately from each other. The plural adhesive film portions are positioned as far as possible from the rotation center of sensor chip 5 (i.e. central region of the sensor chip 5). Furthermore, the plural adhesive film portions are disposed symmetrically about the rotation center of sensor chip 5.

FIGS. 6 to 9 are plan views showing practical examples of the plural adhesive film portions formed on a circuit chip in accordance with the second embodiment of the present invention. According to the practical examples shown in FIGS. 6 to 9, a total area of plural adhesive film portions 4a and 4b (or 4a to 4d) is smaller than the area of the sensor chip 5. Therefore, the adhesive film 4 of the second embodiment as a whole has a small spring constant.

Figure 6:
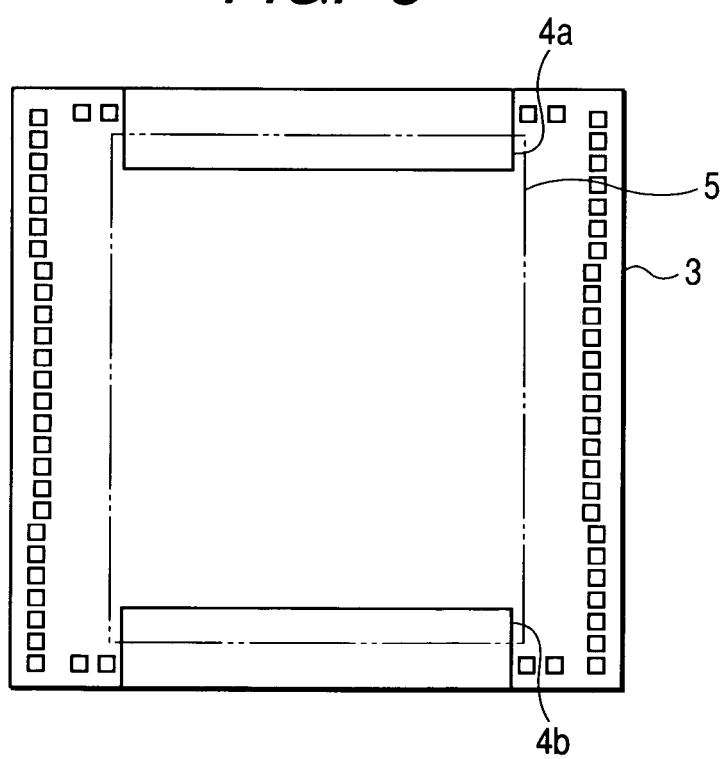
FIG. 6 is a plan view showing a practical example of plural adhesive film portions formed on a circuit chip in accordance with a second embodiment of the present invention.
Figure 7:
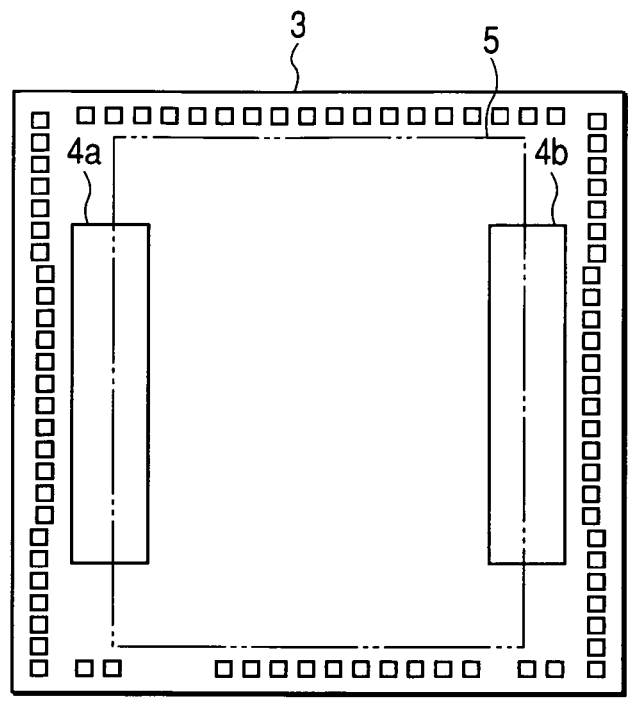
FIG. 7 is a plan view showing another practical example of the plural adhesive film portions formed on a circuit chip in accordance with the second embodiment of the present invention.

According to the example shown in FIG. 6, two adhesive film portions 4a and 4b are disposed along two opposed short sides of rectangular sensor chip 5. According to the example shown in FIG. 7, two adhesive film portions 4a and 4b are disposed along two opposed long sides of rectangular sensor chip 5. The arrangements shown in FIGS. 6 and 7 can improve the vibration-proof properties because two separated adhesive film portions can be provided in parallel with the vibrating direction of the oscillator. More specifically, the arrangement shown in FIG. 6 can improve the vibration-proof properties when the oscillator causes vibrations in the right-and-left direction of the drawing. On the other hand, the arrangement shown in FIG. 7 can improve the vibration-proof properties when the oscillator causes vibrations in the up-and-down direction of the drawing.

Figure 8:
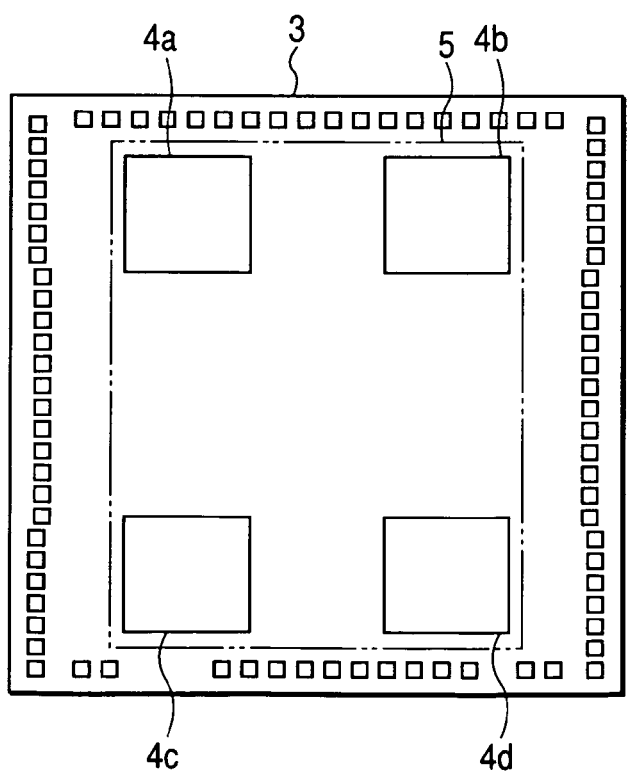
FIG. 8 is a plan view showing another practical example of the plural adhesive film portions formed on a circuit chip in accordance with the second embodiment of the present invention.
Figure 9:
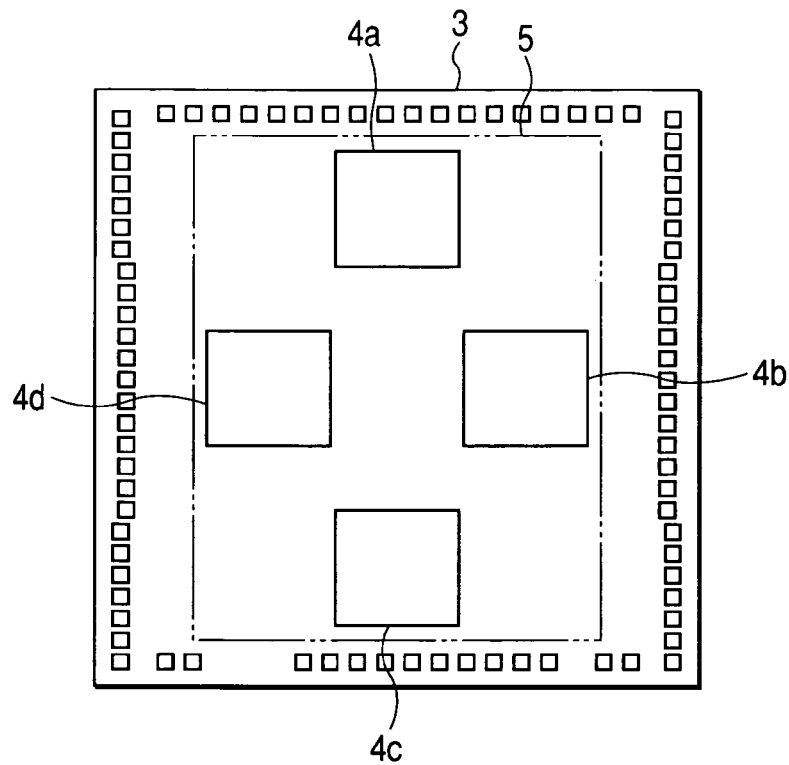
FIG. 9 is a plan view showing another practical example of the plural adhesive film portions films formed on a circuit chip in accordance with the second embodiment of the present invention.

Furthermore, according to the example shown in FIG. 8, a total of four adhesive film portions 4a, 4b, 4c and 4d are disposed at the positions corresponding to four corners of rectangular sensor chip 5. According to the example shown in FIG. 9, a total of four adhesive film portions 4a, 4b, 4c and 4d are disposed at midpoints of respective four sides of the rectangular sensor chip 5.

As described above, the adhesive film 4 of the second embodiment consists of a plurality of adhesive film portions which are spaced from the rotation center of sensor chip 5 as far as possible and are disposed symmetrically about the rotation center of sensor chip 5. Thus, the second embodiment of the present invention can provide an angular rate sensor capable of not only securing vibration-proof properties but also preventing the resonance point in the rotation mode from lowering. Accordingly, the second embodiment of the present invention can assure appropriate detection sensitivity of angular velocity.

Third Embodiment

Next, a third embodiment of the present invention will be explained with reference to FIGS. 10 and 11. The third embodiment is different from the above-described first embodiment in that the sensor chip 5 includes two oscillators.

Figure 10:
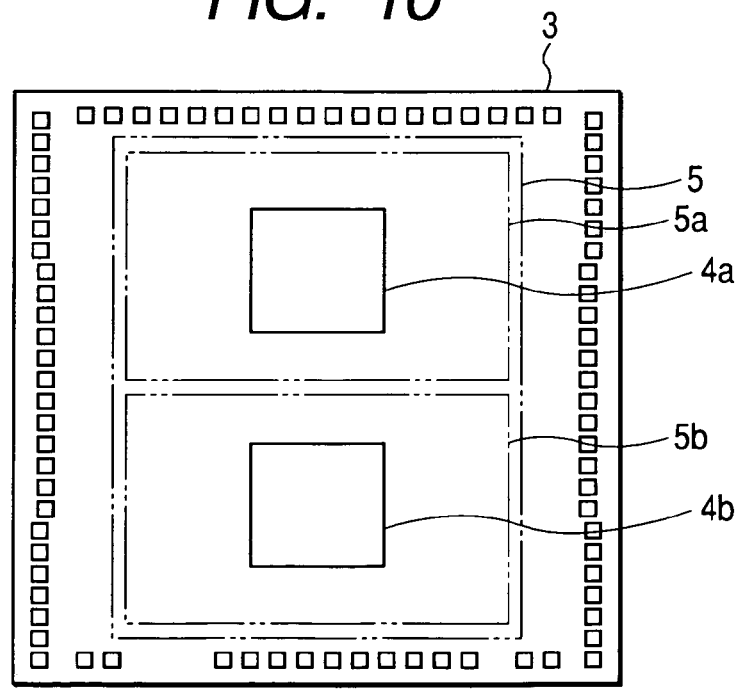
FIG. 10 is a plan view showing a practical example of plural adhesive film portions formed on a circuit chip in accordance with a third embodiment of the present invention.
Figure 11:
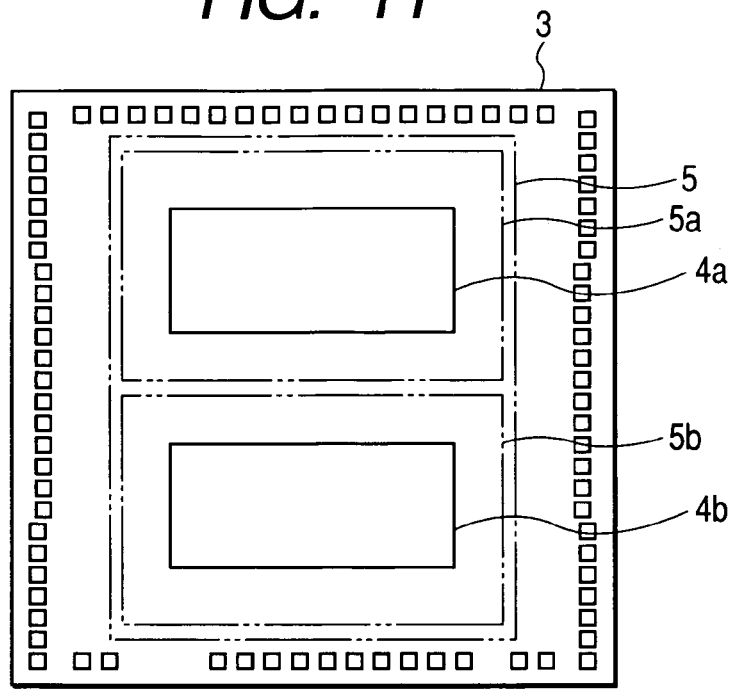
FIG. 11 is a plan view showing another practical example of the plural adhesive film portions formed on a circuit chip in accordance with the third embodiment of the present invention.

FIGS. 10 and 11 are plan views showing practical examples of plural adhesive film portions 4a and 4b formed on a circuit chip in accordance with a third embodiment of the present invention. According to the third embodiment of the present invention, the sensor chip 5 has two dissected oscillators 5a and 5b disposed in such a manner that their acceleration detecting sensitivities can be cancelled. From the view point of relaxing the thermal stresses acting on respective oscillators 5a and 5b, two adhesive film portions 4a and 4b are bonded so as to agree at their centers with the rotation axes (i.e. Z axes) of respective oscillators 5a and 5b as shown in FIGS. 10 and 11. According to this arrangement, the thermal stresses acting on respective oscillators 5a and 5b can be symmetrically arranged.

Furthermore, according to the sensor chip 5 having two oscillators 5a and 5b, bonding the adhesive film portions 4a and 4b to corresponding oscillators 5a and 5b makes it possible to symmetrically dispose the adhesive film portions 4a and 4b about the rotation center of the sensor chip 5. Thus, it becomes possible to prevent the resonance point in the rotation mode from lowering.

According to this embodiment, the driving frequency fd of the oscillators 5a and 5b and the structural resonance frequency fm of the sensor chip 5 satisfy the relationship of $fd > 2^{1/2} \times fm$. To satisfy the required relationship $fd > 2^{1/2} \times fm$, it is preferable to adjust the structural resonance frequency fm of the sensor chip 5 by adjusting the area, thickness, and physical properties (e.g. elastic coefficient) of the adhesive film 4 by alone or by combination. Furthermore, as comparatively shown in FIGS. 10 and 11, appropriately changing the configuration of the adhesive film portions 4a and 4b in accordance with the mass of sensor chip 5 can realize constant vibration-proof characteristics.

Fourth Embodiment

Figure 12:
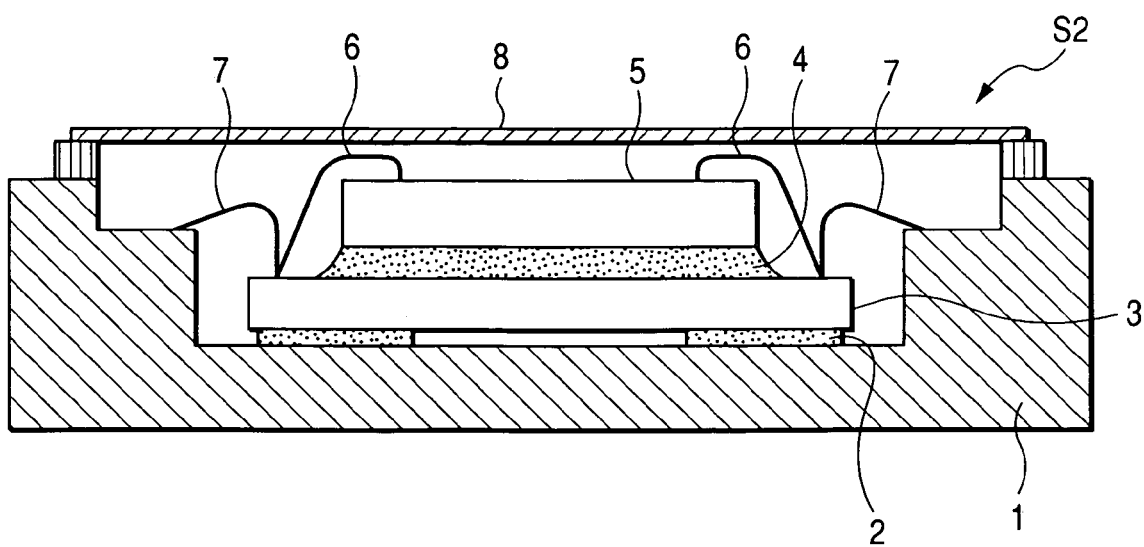
FIG. 12 is a cross-sectional view showing the angular rate sensor in accordance with a fourth embodiment of the present invention.

Next, a fourth embodiment of the present invention will be explained with reference to FIG. 12. The fourth embodiment is different from the above-described first embodiment in that arrangements of the adhesive film 4 and the adhesive 2 are modified. As shown in FIG. 12, an angular rate sensor S2 according to the fourth embodiment includes a ceramic package 1 which arranges a base portion of the sensor S2. A circuit chip 3 is mounted on a bottom of the ceramic package 1 and fixed there with an adhesive 2. A sensor chip 5 is laminated on the circuit chip 3 via an adhesive film 4. According to the angular rate sensor S2 of the fourth embodiment, the adhesive film 4 is entirely provided so as to completely extend along the bottom of the sensor chip 5. On the other hand, the adhesive 2 of the fourth embodiment is partly provided compared with the entire bottom surface of the circuit chip 3. Even in such an arrangement, the driving frequency fd of the oscillator in the sensor chip 5 and the structural resonance frequency fm of the sensor chip 5 satisfy the above-described relationship of $fd > 2^{1/2} \times fm$. The rest of the angular rate sensor S2 is structurally identical with those of the angular rate sensor S1 explained in the first embodiment.

Other Embodiment

According to the above-described first embodiment, the circuit chip 3 and the sensor chip 5 are bonded with the adhesive film 4 and the configuration or the like of the adhesive film 4 is adjusted so as to satisfy the relationship that the structural resonance frequency fm of the sensor chip 5 becomes smaller that the driving frequency fd of the oscillator in the sensor chip 5. However, it is possible to bond the circuit chip 3 and the package 1 with an adhesive film and adjust at least one of configuration or elastic coefficient of the adhesive film to realize a condition that a resonance frequency of an integrated unit of the sensor chip 5 and the circuit chip 3 becomes smaller than the driving frequency fd of the oscillator in the sensor chip 5. Even in such an arrangement, it becomes possible to improve the vibration-proof properties of the sensor chip 5.

What is claimed is:

1. An angular rate sensor comprising:
   a sensor chip having a first area and a predetermined rotation axis that is set at a center of the first area, having an oscillator that is driven to vibrate at a predetermined frequency, and being configured to detect an angular velocity applied to the oscillator around the predetermined rotation axis and output an angular velocity signal indicating the detected angular velocity;
   a circuit chip having a second area facing the sensor chip and being configured to receive the angular velocity signal and extract the detected angular velocity from the angular velocity signal, the second area being larger than the first area; and
   an adhesive film placed between the sensor chip and the circuit chip to connect the first and second areas to each other, configured to have a plurality of adhesive film portions that are i) located so as to be formed across the peripheral edges of the first area, ii) located symmetrically about the predetermined rotation axis, and iii) spaced away from the predetermined rotation axis,
   wherein at least one of shapes and elastic coefficients of the adhesive film portions are set to allow the sensor chip to maintain a resonance frequency smaller than a driving frequency of the oscillator.

2. The angular rate sensor in accordance with claim 1, wherein
   a relationship that the resonance frequency of said sensor chip becomes smaller than $(1/2)^{1/2}$ times the driving frequency of said oscillator is satisfied as a result of at least one of: the selected configuration of said adhesive film portions, and the selected material of the adhesive film having the required elastic coefficient.

3. The angular rate sensor in accordance with claim 1, wherein said plurality of adhesive film portions are disposed in parallel with a direction of vibration of said oscillator.

4. The angular rate sensor in accordance with claim 3,
wherein said sensor chip is formed as a quadrangular sensor chip having a pair of first mutually-opposed sides and a pair of second mutually-opposed sides,
wherein the pair of second mutually opposed sides are shorter than the pair of first mutually-opposed sides, and
wherein the plurality of adhesive film portions are disposed along the pair of first mutually opposed sides, respectively.

5. The angular rate sensor in accordance with claim 3,
wherein said sensor chip is formed as a quadrangular sensor chip having a pair of first mutually-opposed sides and a pair of second mutually-opposed sides,
wherein the pair of second mutually-opposed sides are shorter than the pair of first mutually-opposed sides, and
wherein the plurality of adhesive film portions are disposed along the pair of second mutually opposed sides, respectively.

6. The angular rate sensor in accordance with claim 1,
wherein the plurality of adhesive film portions are four in number,
wherein the sensor chip is formed as a quadrangular sensor chip, and
wherein the four adhesive film portions are disposed at four corners of the quadrangular sensor chip, respectively.

7. The angular rate sensor in accordance with claim 1,
wherein the plurality of adhesive film portions are four in number, and
wherein the sensor chip is formed as a quadrangular sensor chip, and
wherein the four adhesive film portions are disposed as far as possible from the rotation center of the quadrangular sensor chip.

8. The angular rate sensor in accordance with claim 1,
wherein the plurality of adhesive film portions are four in number,
wherein the sensor chip is formed as a quadrangular sensor chip having four sides, and
wherein the four adhesive film portions are disposed at midpoints of the respective four sides of the quadrangular sensor chip, respectively.

9. The angular rate sensor in accordance with claim 1,
wherein the oscillator consists essentially of a plurality of oscillators.

* * * * *